(12) United States Patent
Bailey et al.

(10) Patent No.: US 6,424,527 B1
(45) Date of Patent: Jul. 23, 2002

(54) COMPUTER BOARD SUPPORT AND HEAT SINK RETENTION APPARATUS

(75) Inventors: Mark M. Bailey, Austin; Ty R. Schmitt, Round Rock, both of TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/951,367

(22) Filed: Sep. 11, 2001

(51) Int. Cl.⁷ .................................................. H05K 7/20
(52) U.S. Cl. ........................ 361/687; 361/704; 361/756; 174/16.3; 439/64
(58) Field of Search .................... 361/684, 687–689, 361/692, 702–710, 726, 732, 737, 740, 741–742, 747, 752–756, 758, 759, 800–807, 697; 312/233.1, 233.2, 223.6; 211/41.17; 439/64, 95, 377, 485–487; 24/473, 625, 453, 457, 458; 248/316, 7, 500, 505, 510; 257/706, 711; 165/80.2, 80.3, 80.4, 185

(56) References Cited

U.S. PATENT DOCUMENTS

| | | |
|---|---|---|
| 5,331,507 A | 7/1994 | Kyung et al. |
| 5,448,449 A | 9/1995 | Bright et al. |
| 5,600,540 A | 2/1997 | Blomquist |
| 6,186,800 B1 * | 2/2001 | Klein et al. ..................... 439/95 |
| 6,249,428 B1 * | 6/2001 | Jeffries et al. ............... 361/684 |
| 6,341,065 B1 * | 1/2002 | Lo ............................... 361/704 |
| 6,344,971 B1 * | 2/2002 | Ju ................................ 361/704 |
| 6,345,994 B1 * | 2/2002 | Johnson ........................ 439/95 |

* cited by examiner

*Primary Examiner*—Darren Schuberg
*Assistant Examiner*—Michael Datskovsky
(74) *Attorney, Agent, or Firm*—Haynes and Boone, LLP

(57) ABSTRACT

A computer board support apparatus includes an elongated one-piece body having opposite terminal ends attached to a first side of a computer board. The bracket includes a plurality of spaced apart arms extending between the terminal ends and a plurality of locking support feet extending from the body adjacent the arms. A plurality of spaced apart brackets are mounted on a second side of the board opposite the first side. A plurality of fasteners extend through the terminal ends of the body, through the board and engage the brackets for securing the apparatus to the board. A microprocess is mounted on the board between the brackets. A heatsink is mounted on the brackets and in contact with the microprocessor for transferring heat from the microprocessor.

22 Claims, 4 Drawing Sheets

COMPUTER BOARD SUPPORT AND HEAT SINK RETENTION APPARATUS

BACKGROUND

The disclosures herein relate generally to computer systems and more particularly to a device that limits the bending and flexing of a computer board.

As the speed of computer microprocessors continues to increase, the heat that they are generating increases. Heat dissipating bodies such as heatsinks are often used to cool microprocessors. Faster processors are requiring larger, heavier heatsinks whose weight can cause the computer board to bend and flex when the heatsink is mounted to the board and when the board is subject to shock and vibrations while mounted to the computer chassis. Flexing of the computer board can be extremely damaging to the traces and components on the board.

A prior method used to solve this problem incorporated a bracket assembly including a plurality of pieces that mounted to the computer board and chassis. This solution kept the board from flexing when subject to shock and vibration, but only when the assembly was mounted in the chassis. Prior to mounting to the chassis, the board was subject to flexing and bending due to forces associated with the mounting of the heatsink on the board. In addition, the plurality of pieces are orientation specific, adding time and cost to the manufacturing and assembly of the computer system.

Therefore, what is needed is a support device that supports the computer board both prior to the board being mounted in the chassis, and also once the board has been mounted in the chassis. The support device is required to simplify the computer system manufacturing and assembly process, thereby reducing costs associated with such processes.

SUMMARY

One embodiment, accordingly, provides a support device that gives support to the computer board both prior to chassis mounting and once the board has been mounted to the chassis. The embodiment provides a one-piece support member with a means for mounting to the computer board independent of its orientation and a means for mounting to the computer chassis. To this end, a computer board support device includes an elongated one-piece body having opposed terminal ends, a plurality of spaced apart arms extending between the terminal ends, and a plurality of locking support feet extending from the body adjacent the spaced apart arms. A bracket is provided for attaching each terminal end to a computer board.

A principle advantage of this embodiment is that for areas of the computer board that experience high forces, the support device may be used to support the board both prior to its mounting in the chassis and once it has been mounted in the chassis. The orientation-independent design simplifies the manufacturing and assembly process of the computer system, thereby reducing costs associated with those processes.

DETAILED DESCRIPTION

Figure 1:
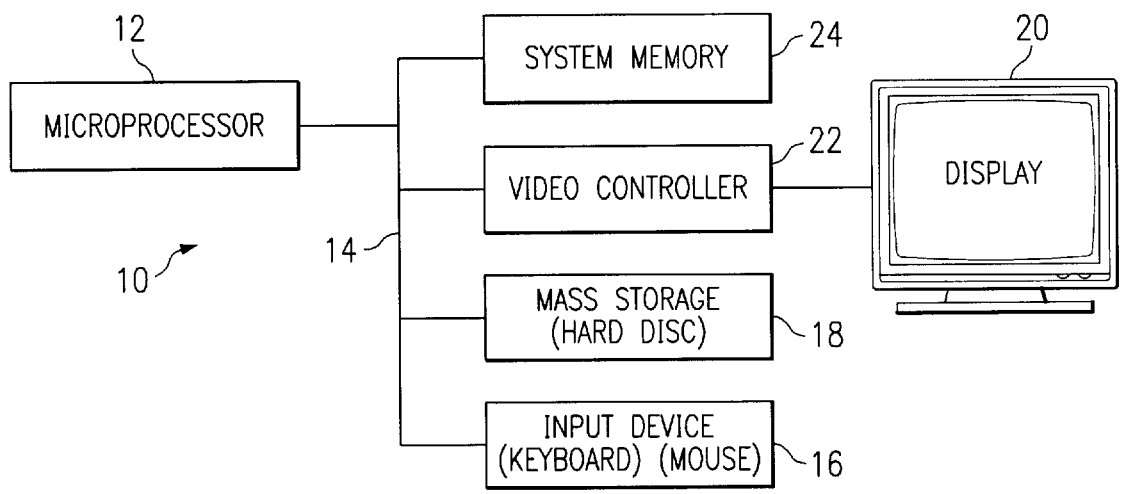
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input system 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
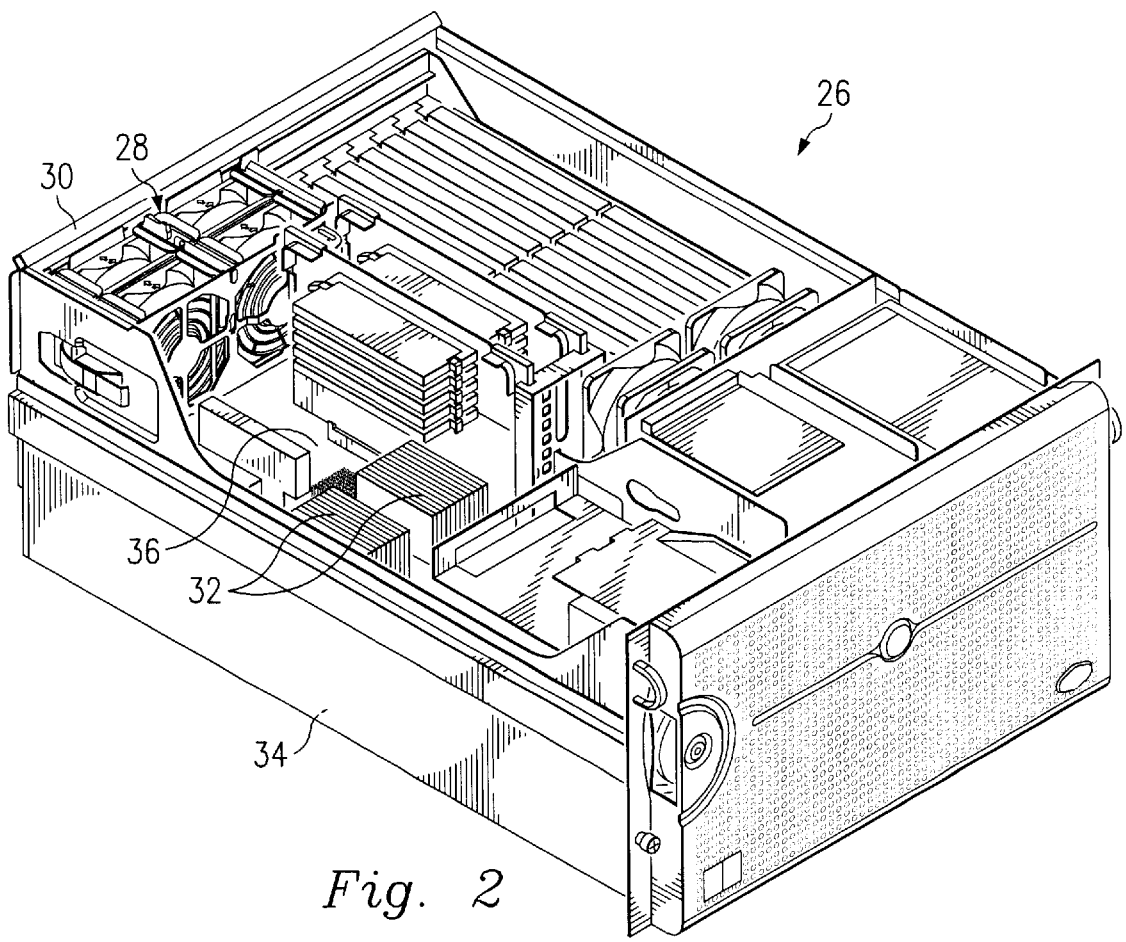
FIG. 2 is a perspective view illustrating an embodiment of a server chassis.

A server chassis is generally designated 26 in FIG. 2 and includes a fan assembly 28 for cooling components in the chassis 26 and drawing air across a plurality of heatsinks 32. The fan assembly 28 is positioned adjacent a ventilated wall 30 of chassis 26. Although chassis 26 is described as a server chassis, any electronic housing which requires cooling is contemplated.

Figure 3:
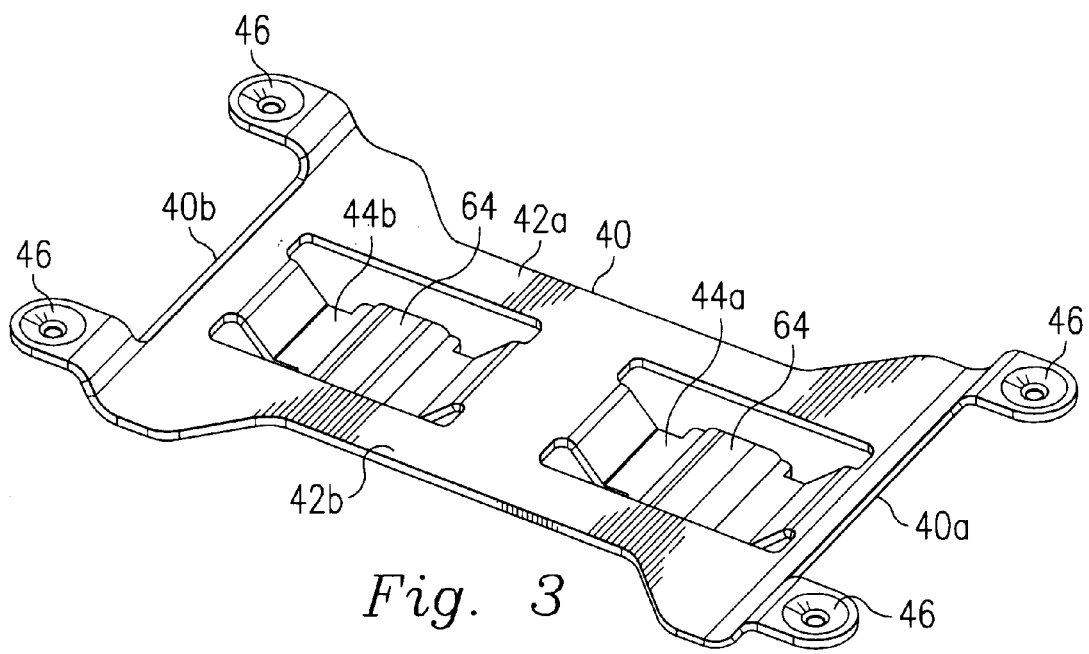
FIG. 3 is a perspective view illustrating an embodiment of a support body.

Chassis 26 includes a base or support surface 34, not visible in FIG. 2, which supports a computer board 36 on which computer components and printed circuits are mounted. A computer board support apparatus 38, FIGS. 3 and 4, includes an elongated one-piece metal body 40 having opposed terminal ends 40a and 40b. A plurality of spaced apart arms 42a and 42b, preferably two, extend between the terminal ends 40a and 40b. A plurality of locking support feet 44a and 44b, preferably two, extend from the body 40 adjacent to and between the arms 42a, 42b. The terminal ends 40a, 40b include attachment apertures 46 for receiving fasteners, discussed below in greater detail.

Figure 4:
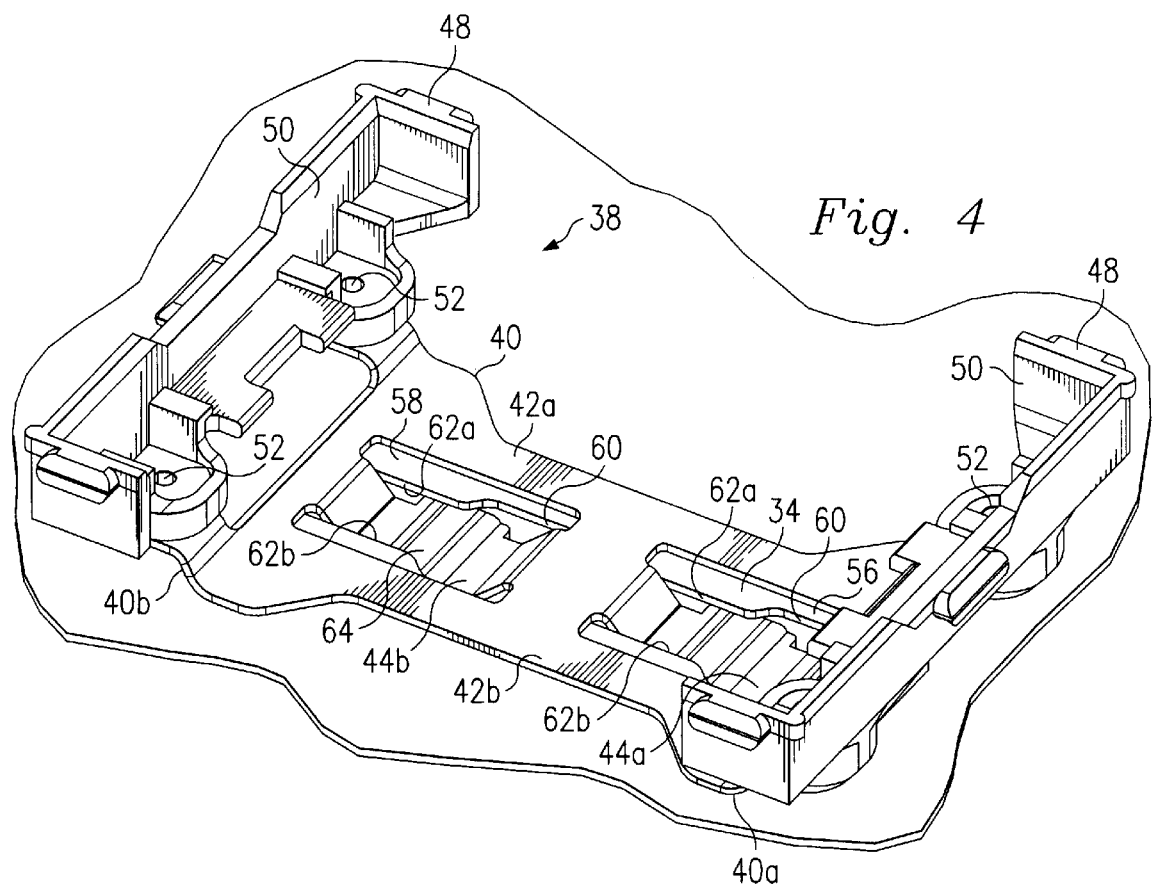
FIG. 4 is a perspective view illustrating an embodiment of a support body and brackets.

A bracket 48, FIG. 4, preferably formed of a synthetic, non-conductive material, is provided for attaching each terminal end 40a and 40b to the computer board 36 illustrated in FIG. 2. Each bracket 48 includes a recessed portion 50 for receiving a heatsink, discussed below. A plurality of attachment apertures 52, which are alignable with attachment apertures 46, are also provided in each bracket 48. The brackets 48 and the body 40 comprise the computer board support apparatus 38. The brackets 48 of FIG. 4 are illustrated in connection with the body 40. In use however, the body 40 is attached to a first side 36a of the board 36, FIG. 5, and the brackets 48 are mounted on a second side 36b of the board 36, opposite the first side 36a.

Figure 6:
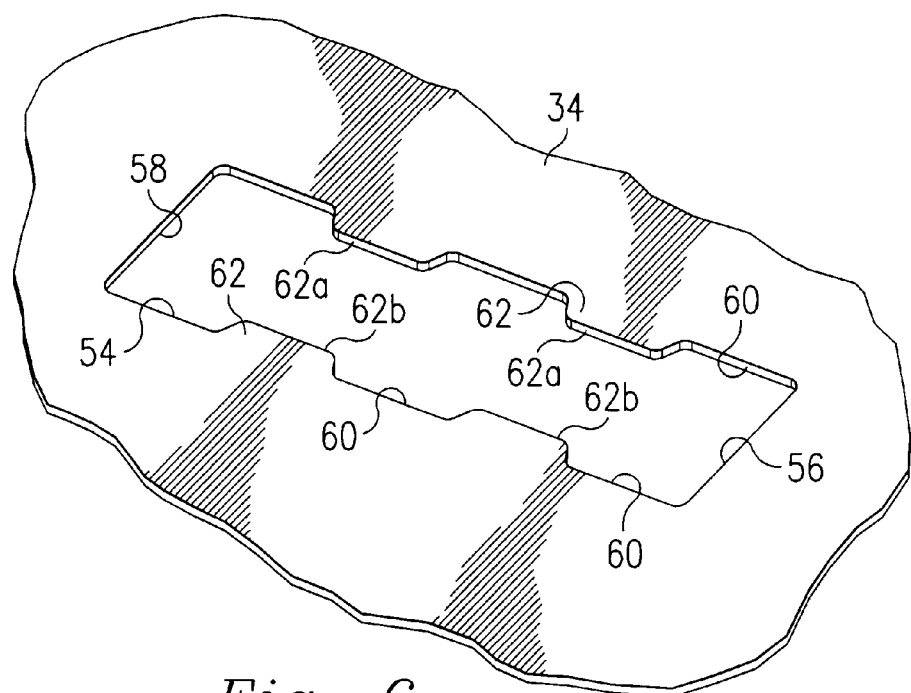
FIG. 6 is a perspective view illustrating an embodiment of a slot for receiving the support body.

In FIG. 6, a portion of the support surface 34 is illustrated including a locking slot 54 formed therein, which is an elongated slot having a first end 56, a second end 58, a pair of enlarged portions 60, and a pair of reduced portions 62 formed by opposed flanges 62a and 62b. Again in FIG. 3, the locking support feet 44a, 44b, each include extended flared portions 64. In FIG. 4, it can be seen that when locking feet 44a, 44b are simultaneously inserted into enlarged portions 60, and body 40 is moved toward second end 58, the flared portions 64 slidably engage the opposed flanges 62a and 62b of surface 34. This engagement secures body 40 onto support surface 34 of chassis 26. For disengagement, body 40 is moved toward first end 56 to a position where flared portions 64 are aligned with enlarged portions 60. This is further illustrated in FIG. 5, where body 40 engages a face 34b of chassis surface 34, and feet 44a, 44b are engaged with face 34a of chassis surface 34.

Figure 5:
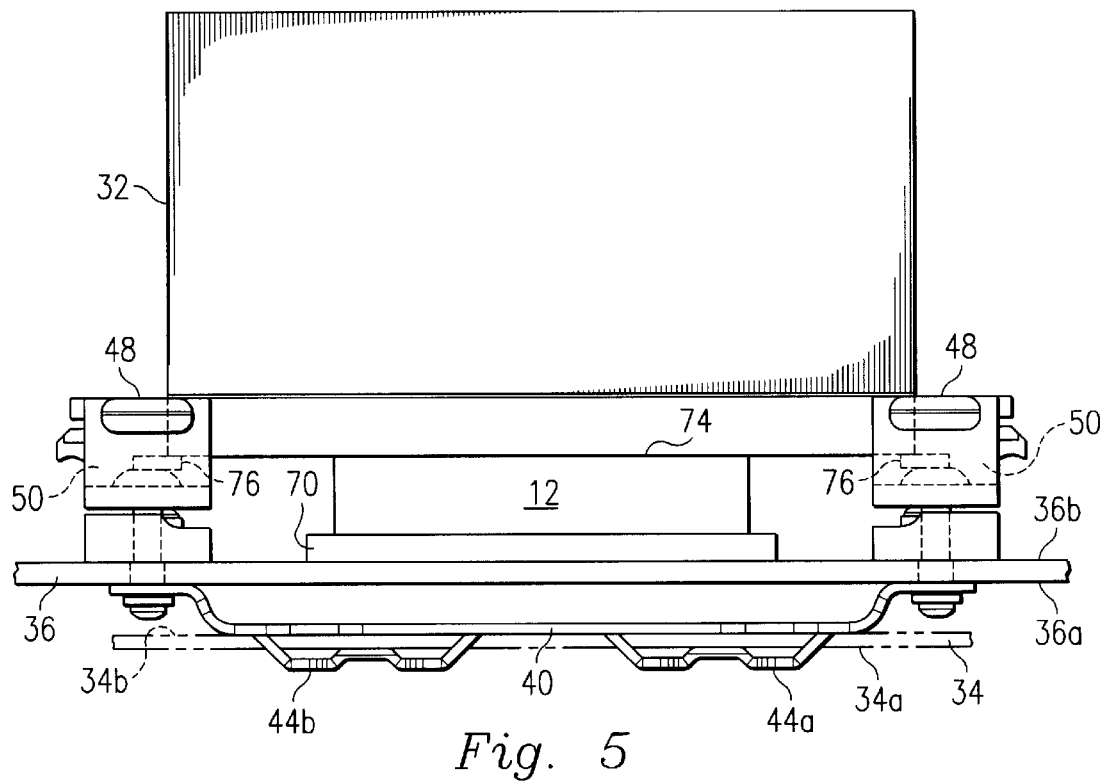
FIG. 5 is a side elevational view illustrating an embodiment of a heatsink mounted in the brackets.

Further in FIG. 5, a socket 70 is mounted on board 36 and processor 12 is attached to socket 70. The heatsink 32 is mounted in recesses 50 of brackets 48. Heatsink 32 engages processor 12 at an interface 74 which may include a thermal interface material. It is also possible to include a conductive member 76 engaged with heatsink 32 and a plurality of fasteners 78. In this manner, the fasteners 78 which secure brackets 48 and body 40 to board 36 can provide an EMI path between heatsink 32 and chassis surface 34.

Figure 7:
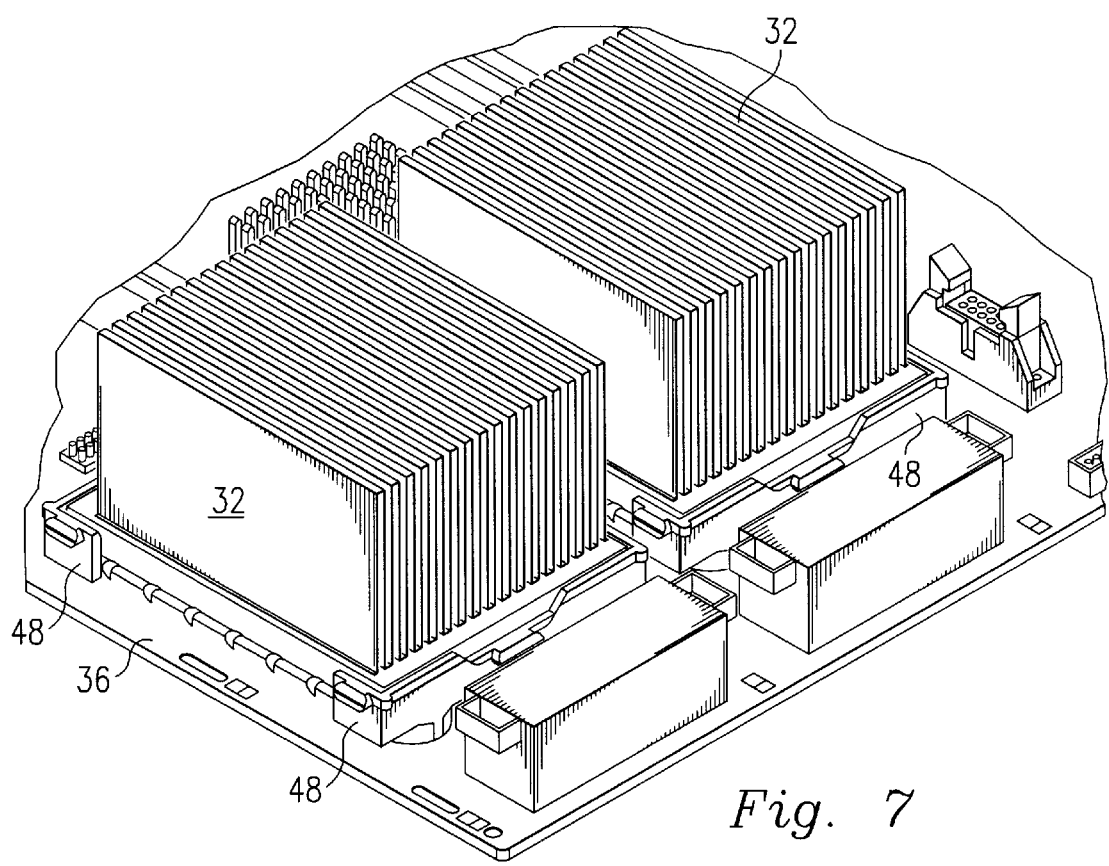
FIG. 7 is a perspective view illustrating an embodiment of a plurality of heatsinks mounted on a computer board.

FIG. 7 illustrates the pair of heatsinks 32 mounted side-by-side which are mounted on brackets 48 which are mounted on board 36. In this instance, a pair of side-by-side slots 54, discussed above and illustrated in FIG. 6, are provided in chassis surface 34 for receiving a pair of elongated bodies 40.

In operation, a body 40 is attached to side 36a of board 36 and brackets 48 are attached to side 36b of board 36. Alignment of apertures 46 of body 40 and apertures 52 of brackets 48, permits fasteners 78 to secure the board support apparatus 38 to board 36. This can be accomplished prior to shipment of board 36 and final assembly.

When board 36 is assembled in chassis 26, and with heatsinks 32 seated in brackets 48 and retained by well known retention clips (not shown), feet 44a, 44b are inserted into enlarged portions 60 of slot 54. Movement of board 36 and body 40 toward second end 58 of slot 54 engages flared portions 64 with opposed flanges 62a, 62b. Removal of board 38 accomplished by movement of board 36 and body 40 toward first end 56 to align flared portions with enlarged portions 60.

As can be seen, the principal advantages of these embodiments are that only one design is needed for body 40 and bracket 48. The board 36 is supported from flexing when subjected to forces resulting from shock and vibration. The board 36 is supported before and after assembly, i.e. bending is avoided prior to assembly and after assembly of heatsink retention clips. Also, ah EMI ground path can be provided if desired.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A computer board support apparatus comprising:
   an elongated one-piece body having opposed terminal ends;
   a plurality of spaced apart arms extending between the terminal ends;
   a plurality of locking support feet extending from the body adjacent the spaced apart arms; and
   a bracket for attaching each terminal end to a computer board.

2. The apparatus as defined in claim 1 wherein there are two arms and the support feet are positioned between the arms.

3. The apparatus as defined in claim 1 wherein the terminal ends include attachment apertures for receiving fasteners.

4. The apparatus as defined in claim 3 wherein each bracket includes attachment apertures for receiving the fasteners.

5. The apparatus as defined in claim 4 wherein each bracket includes a recessed portion.

6. A computer board support apparatus comprising:
   a computer board having opposite sides;
   an elongated one-piece body having opposite terminal ends attached to a first side of the board;
   a plurality of spaced apart arms extending between the terminal ends;
   a plurality of locking support feet extending from the body adjacent the spaced apart arms;
   a plurality of spaced apart brackets mounted on a second side of the board opposite the first side; and
   a plurality of fasteners extending through the terminal ends of the body, through the board and engaged with the brackets.

7. The apparatus as defined in claim 6 wherein there are two arms and the support feet are positioned between the arms.

8. The apparatus as defined in claim 6 wherein the terminal ends include attachment apertures for receiving fasteners.

9. The apparatus as defined in claim 8 wherein each bracket includes attachment apertures for receiving the fasteners.

10. The apparatus as defined in claim 9 wherein each bracket includes a recessed portion.

11. A computer system comprising:
    a chassis;
    a computer board mounted in the chassis, the computer board having opposite sides;
    a microprocessor mounted on the computer board;
    a storage coupled to the microprocessor;
    a video controller coupled to the microprocessor;
    a memory coupled to provide storage to facilitate execution of computer programs by the microprocessor;
    an elongated one-piece body having opposite terminal ends attached to a first side of the board;
    a plurality of spaced apart arms extending between the terminal ends;
    a plurality of chassis locking support feet extending from the body adjacent the spaced apart arms;
    a plurality of spaced apart brackets mounted on a second side of the board opposite the first side, the brackets being positioned adjacent the microprocessor; and
    a plurality of fasteners extending through the terminal ends of the body, through the board and engaged with the brackets.

12. The system as defined in claim 11 wherein there are two arms and the support feet are positioned between the arms.

13. The system as defined in claim 11 wherein the terminal ends include attachment apertures for receiving fasteners.

14. The system as defined in claim 13 wherein each bracket includes attachment apertures for receiving the fasteners.

15. The system as defined in claim 14 wherein each bracket includes a recessed portion.

16. The system as defined in claim 11 wherein the chassis includes at least one locking slot for receiving the chassis locking support feet.

17. The system as defined in claim 16 wherein the chassis locking support feet are slidably engaged with the locking slot.

18. The system as defined in claim 11 further comprising:

a heatsink mounted on the brackets and engaged with the microprocessor.

19. A method of limiting flexure of a computer board comprising:

providing a computer board having opposite sides;

attaching an elongated one-piece body to a first side of the board, the body having opposite terminal ends;

extending a plurality of spaced apart arms between the terminal ends;

extending a plurality of support feet from the body adjacent the spaced apart arms;

mounting a plurality of spaced apart brackets on a second side of the board opposite the first side;

extending a plurality of fasteners through the terminal ends of the body and through the board; and engaging the fasteners with the brackets.

20. The method as defined in claim 19 further comprising:

providing a chassis for receiving the computer board.

21. The method as defined in claim 20 further comprising:

providing at least one locking slot in the chassis.

22. The method as defined in claim 21 further comprising:

slidably engaging the support feet in the locking slot.

\* \* \* \* \*